US007948806B2

(12) United States Patent
Savignac et al.

(10) Patent No.: US 7,948,806 B2
(45) Date of Patent: May 24, 2011

(54) DEVICE WITH PRECHARGE/HOMOGENIZE CIRCUIT

(75) Inventors: Dominique Savignac, Ismaning (DE); Helmut Schneider, Munich (DE)

(73) Assignee: Qimonda AG, Munich (DE)

( * ) Notice: Subject to any disclaimer, the term of this patent is extended or adjusted under 35 U.S.C. 154(b) by 309 days.

(21) Appl. No.: 12/122,273

(22) Filed: May 16, 2008

(65) Prior Publication Data
US 2009/0122628 A1    May 14, 2009

(30) Foreign Application Priority Data

May 16, 2007    (DE) .......................... 10 2007 023 024

(51) Int. Cl.
*G11C 11/34*    (2006.01)
(52) U.S. Cl. .................... 365/185.25; 365/203; 365/205; 365/207

(58) Field of Classification Search ............. 365/185.25, 365/203, 205, 207
See application file for complete search history.

(56) References Cited

U.S. PATENT DOCUMENTS

| | | | |
|---|---|---|---|
| 5,021,998 A * | 6/1991 | Suzuki et al. ................... 365/51 |
| 6,795,358 B2 | 9/2004 | Tanaka et al. | |
| 7,193,912 B2 | 3/2007 | Obara et al. | |
| 7,440,350 B2 * | 10/2008 | Obara et al. ................... 365/214 |
| 2006/0273407 A1 * | 12/2006 | Iwata et al. .................... 257/393 |
| 2007/0268771 A1 * | 11/2007 | Takemura et al. ........ 365/230.03 |

* cited by examiner

*Primary Examiner* — Vu A Le
*Assistant Examiner* — Han Yang
(74) *Attorney, Agent, or Firm* — Dicke, Billig & Czaja, PLLC

(57) ABSTRACT

A device with a precharge/homogenize circuit. One embodiment provides at least one switching element is acting as a homogenizer, and at least one switching element is acting as a precharger. The diffusion region of the switching element acting as a homogenizer is separated from the diffusion region of the switching element acting as a precharger.

19 Claims, 3 Drawing Sheets

DEVICE WITH PRECHARGE/HOMOGENIZE CIRCUIT

CROSS-REFERENCE TO RELATED APPLICATIONS

This Utility Patent Application claims priority to German Patent Application No. DE 10 2007 023 024.0 filed on May 16, 2007, which is incorporated herein by reference.

BACKGROUND

The invention relates to a device, to a precharge/homogenize circuit for a semiconductor device, and to a method for operating a semiconductor device.

With conventional semiconductor devices with a memory function, one differentiates, for instance, between functional memory devices (e.g., PLAs, PALs, etc.), and table memory devices, e.g., ROM devices (ROM=Read Only Memory, in one embodiment PROMs, EPROMs, EEPROMs, flash memories, etc.), and RAM devices (RAM=Random Access Memory or write-read memory, e.g., DRAMs and SRAMs), etc.

A RAM device is a memory for storing data under a predetermined address and for reading out the data again under this address later.

In the case of SRAMs (SRAM=Static Random Access Memory), the individual memory cells may, for instance, consist of few, for instance, 6 transistors, and in the case of DRAMs (DRAM=Dynamic Random Access Memory), for instance, of only one single, controlled capacitive element (e.g., the gate source capacitance of a MOSFET, or a capacitor, respectively) with the capacitance of which one respective bit can be stored as charge.

This charge, however, remains for a short time only. Therefore, a "refresh" must be performed regularly, e.g., approximately every 64 ms.

In contrast to this, no "refresh" has to be performed with SRAMs, i.e. the data stored in the memory cell remain stored as long as a supply voltage is fed to the SRAM.

In the case of non-volatile memory devices (NVMs), e.g., EPROMs, EEPROMs, and flash memories, the stored data, however, also remain stored if the supply voltage is switched off.

Furthermore, for a short time, "resistive" or "resistively switching" memory devices have been known, e.g., phase change memories or "PCMs", etc.

In the case of RAMs, for instance, in one embodiment e.g., DRAMs, the respective memory cells/capacitors may be connected with bit lines that serve to transmit a data value that is to be read out from a memory cell, or a data value that is to be read into the memory cells.

On reading out a memory cell, an access transistor that is connected with the capacitor or the capacitive element of a memory cell can be connected through by the activation of a word line, and the charge state stored in the capacitor or the capacitive element can be applied to the bit line.

Then, a weak signal emanating from the capacitor or the capacitive element may be amplified by a read or write/sense amplifier. The read or write/sense amplifier may include complementary signal inputs. The bit lines connected with these signal inputs are referred to as bit line and complementary bit line.

With today's RAMs, in one embodiment DRAMs, "shared sense amplifiers" may be used as read or write/sense amplifiers so as to save chip space. In this case, a read or write/sense amplifier is used both during the reading out of a memory cell at the left side and of a memory cell at the right side along respective bit lines that are associated with a read or write/sense amplifier.

Prior to the reading out of the memory cells, the corresponding bit line sections, i.e. the corresponding sections of the non-complementary bit line and of the complementary bit line, may be precharged to the same potential by precharge/homogenize circuits that are connected with the bit lines. This potential may, for instance, correspond to half the voltage of a bit line in a logic high state (i.e., for instance, VBLH/2). This ensures that, prior to the reading out of data, no differences occur between the potential of the section of the bit line and the section of the complementary bit line, which could otherwise swap the small amount of charge that is transmitted to be bit lines by the capacitor or the capacitive element of a memory cell during the reading out. Directly prior to the reading out of the memory cells, the precharge/homogenize circuits that are connected with the bit line sections that are associated with the memory cell to be read out may be switched off.

Conventional precharge/homogenize circuits may, for instance, consist of three NMOS transistors each. The source drain path of a first one of the three NMOS transistors is connected between the bit line and the complementary bit line; the source drain paths of the two other NMOS transistors are connected in series, wherein the series connection is also connected between the bit line and the complementary bit line. The above-mentioned voltage VBLH/2 may be applied at the connection point of the source drain paths of the two NMOS transistors. The gates of the three NMOS-FETs are connected with each other and may be connected to a control voltage EQL that is supplied by a control circuit so as to switch the precharge/homogenize circuit on and off.

In one embodiment the relatively large path resistance to a NMOS transistor and the variable coupling of the precharge/homogenize circuit control voltage to the bit lines may, for instance, be of disadvantage with conventional precharge/homogenize circuits.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide a novel precharge/homogenize circuit for a semiconductor device, a novel device, and a novel method for operating a semiconductor device.

One embodiment provides a precharge/homogenize circuit for a semiconductor device, including at least one switching element acting as a homogenizer, and at least one switching element acting as a precharger, wherein the diffusion region of the switching element acting as a homogenizer is separated from the diffusion region of the switching element acting as a precharger.

Figure 1:
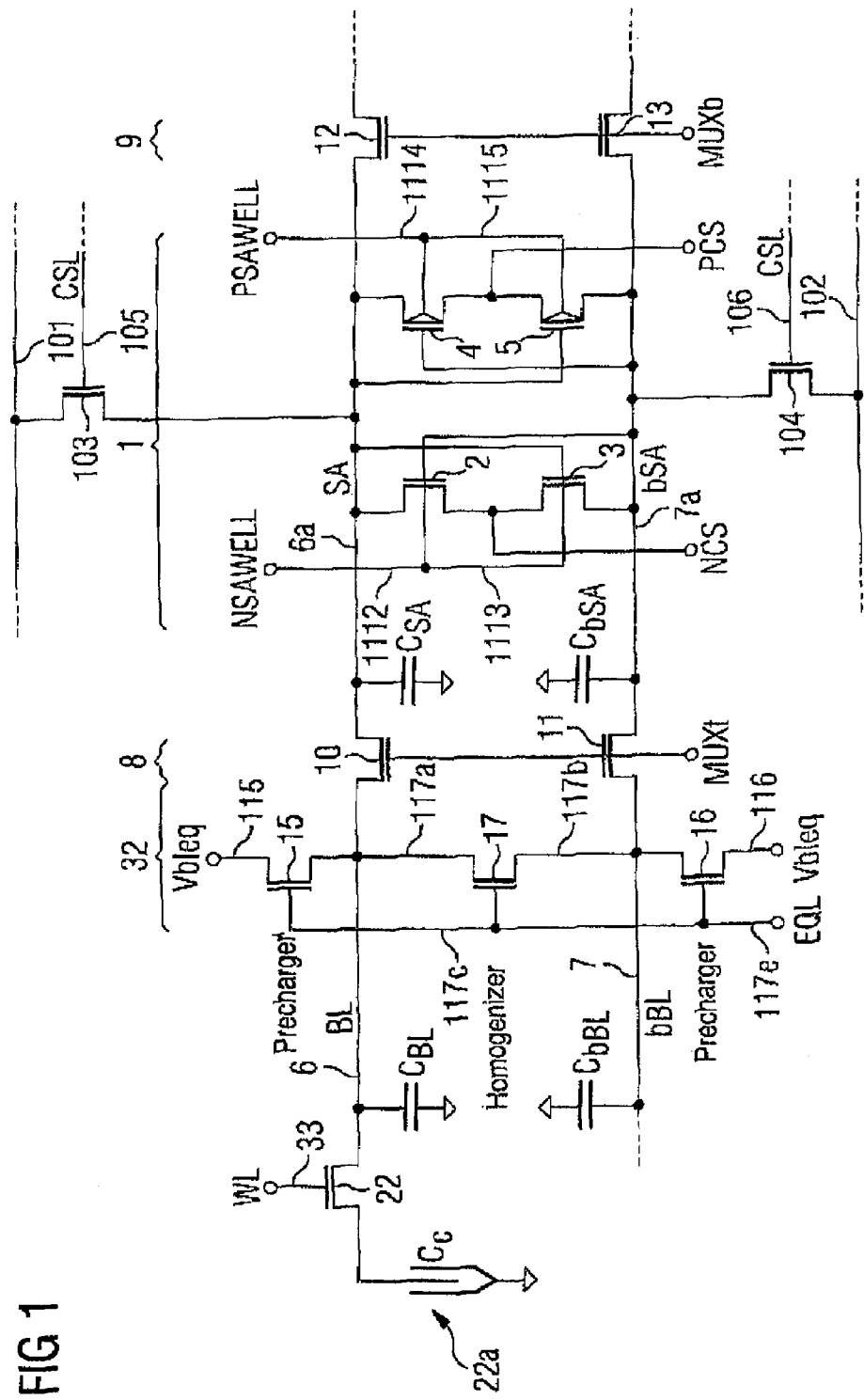
FIG. 1 illustrates a schematic detailed representation of the structure of a partial section of a semiconductor device with which a precharge/homogenize circuit according to one embodiment can be used.

FIG. 1 illustrates, schematically, a partial section of a semiconductor device, here: a DRAM (Dynamic Random Access Memory), in which a precharge/homogenize circuit 32 according to one embodiment can be used.

Instead with DRAMs, the precharge/homogenize circuit 32 illustrated in FIG. 1 or a precharge/homogenize circuit may, for instance, also be used with any other semiconductor devices, e.g., with micro processors or micro controllers, in one embodiment, for instance, with micro processors or micro controllers with an (additional) memory function, etc., or with semiconductor memory devices, e.g., with functional memory devices (e.g., PLAs, PALs, etc.), and table memory devices, e.g., ROM devices (ROM=Read Only Memory, in one embodiment PROMs, EPROMs, EEPROMs, flash memories, etc.), and other RAM devices than DRAMs, e.g., with SRAMs (SRAM=Static Random Access Memory), etc., etc.

As is illustrated in FIG. 1, the semiconductor device includes a read or write/sense amplifier 1 that consists, for instance, of two NMOS-FETs 2 and 3 and two PMOS-FETs 4 and 5 which are connected with each other in a flip-flop manner.

One end of the source drain path of the first NMOS-FET 2 is connected with a line 6a (line SA) which, as will be explained in the following, is adapted to be connected with corresponding sections of a bit line 6 (bit line BL) (or is part of the bit line 6, respectively (cf. below)). Moreover, the gate of the first NMOS-FET 2 is connected with a further line 7a (line bSA) which, as will also be explained in the following, is adapted to be connected with corresponding sections of a bit line 7 (bit line bBL) (or is part of the bit line 7 (cf. below)) which is complementary to the bit line 6. Furthermore, the other end of the source drain path of the first NMOS-FET2 is connected with an end of the source drain path of the second NMOS-FET 3, the source drain path of which is at its other end connected with the line 7a. Moreover, the gate of the second NMOS-FET 3 is connected with the line 6a.

One end of the source drain path of the first PMOS-FET 4 is connected with the line 6a that is adapted to be connected with corresponding sections of the bit line 6 (or is part of the bit line 6, respectively). Moreover, the gate of the first PMOS-FET 4 is connected with the line 7a that is adapted to be connected with corresponding sections of the complementary bit line 7 (or is part of the bit line 7, respectively). Furthermore, the other end of the source drain path of the first PMOS-FET 4 is connected with an end of the source drain path of the second PMOS FET 5, the source drain path of which is at its other end connected with the line 7a. Moreover, the gate of the second PMOS-FET 5 is connected with the line 6a.

If the read or write/sense amplifier 1 is to be activated, appropriate voltages NCS or PCS are applied to the connection points of the source drain paths of the two NMOS-FETs 2 and 3 and of the two PMOS-FETs 4 and 5.

The read or write/sense amplifier 1 is (in the drawing according to FIG. 1 to the left and to the right) connected with corresponding isolation circuits 8 or 9, respectively. The isolation circuits 8 and 9 each consist of two NMOS-FETs 10, 11 or 12, 13, the source drain paths of which are configured to interrupt the bit lines 6 and 7 so as to uncouple the corresponding side of the read or write/sense amplifier 1 from corresponding bit line sections during the reading out or the writing of data from or in the memory cells that are positioned at the respectively other side of the read or write/sense amplifier 1.

The gates of the NMOS-FETS 10, 11 or 12, 13 of the isolation circuits 8, 9 which are connected with each other may be controlled via a control voltage MUXt (in the case of the isolation circuit 8 at the left side of the read or write/sense amplifier 1 in the drawing) or a control voltage MUXb (in the case of the isolation circuit 9 at the right side of the read or write/sense amplifier in the drawing).

The DRAM section illustrated in FIG. 1 includes moreover corresponding precharge/homogenize circuits 32, namely a first precharge/homogenize circuit 32 that is arranged at the left side of the isolation circuit 8 in FIG. 1, and a second precharge/homogenize circuit (not illustrated) that is constructed and connected correspondingly similar or identical to the first precharge/homogenize circuit and that is arranged at the right side of the isolation circuit 9.

The precharge/homogenize circuits 32 serve to charge the corresponding sections of the bit line 6 and of the complementary bit line 7 to the same voltage prior to the reading out of data from or the writing of data in a memory cell, e.g., a voltage that corresponds to half the voltage of a bit line in a logic high state (VBLH/2).

Every precharge/homogenize circuit consists of three NMOS transistors 15, 16, 17. The source drain path of a first NMOS transistor 17 of the three corresponding NMOS transistors of a corresponding precharge/homogenize circuit 32 which acts as a "homogenizer" is, via corresponding bit lines 117a or 117b, connected between the bit line 6 and the complementary bit line 7.

The source drain path of a second NMOS transistor 15 of the three corresponding NMOS transistors which acts as a "precharger" is connected between the bit line 6 and a line 115 to which a (constant) voltage Vbleq can be applied.

Correspondingly similar, the source drain path of a third NMOS transistor 16 of the three corresponding NMOS transistors which also acts as a "precharger" is connected between the complementary bit line 7 and a line 116 to which, also, the above-mentioned (constant) voltage Vbleq can be applied.

The gates of the three NMOS-FETs 15, 16, 17 of the respective precharge/homogenize circuit 32 are connected with each other via corresponding lines 117c, etc. and are adapted to be connected, via a line 117e, to a control voltage EQL that is supplied by a corresponding control circuit (not illustrated in FIG. 1) so as to switch the respective precharge/homogenize circuit 32 on and off.

The DRAM includes a plurality of memory cells 22a that are arranged in the form of a matrix of rows and columns. Every memory cell 22a has, for instance, a storage capacitance Cc that may be connected with the bit lines 6 or 7 via the source drain path of a corresponding access transistor 22 that consists of an NMOS-FET.

The access transistors 22 can be controlled via corresponding word lines 33.

As is further illustrated in FIG. 1, a first local data line 101 is adapted to be connected with the bit line 6 via the source drain path of a corresponding transistor 103 ("bit switch") (here: an NMOS-FET), and a second local data line 102 is adapted to be connected with the complementary bit line 7 via the source drain path of a corresponding transistor 104 ("bit switch") (here: an NMOS-FET).

The transistors 103, 104 are adapted to be switched on and off by applying a corresponding control signal CSL to the gates of the transistors 103, 104 (e.g., via corresponding pairs of CSL control lines 105, 106) (so that the bit lines 6, 7 are connected with the local data lines 101, 102/are disconnected from the local data lines 101, 102).

Figure 2:
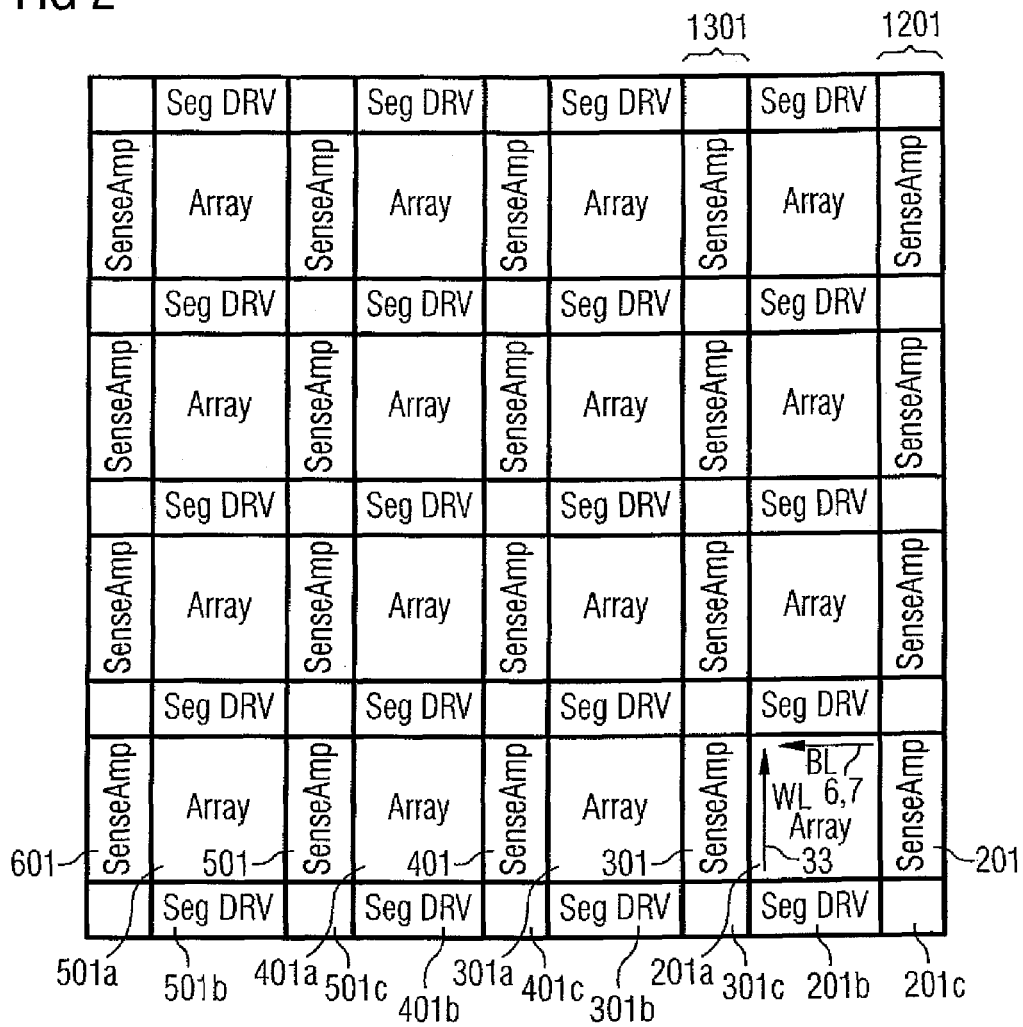
FIG. 2 illustrates a schematic representation of the structure of a section of the semiconductor device which may include the partial section illustrated in FIG. 1, with a plurality of array regions, sense amplifier regions, and segment driver regions.

As is illustrated in FIG. 2, the above-mentioned read or write/sense amplifier 1 (along with a plurality of further, read or write/sense amplifiers being of similar or identical structure as the read or write/sense amplifier 1), and/or the above-mentioned isolation circuits 8, 9 (along with a plurality of further isolation circuits being of similar or identical structure as the isolation circuits 8, 9), and/or the above-mentioned precharge/homogenize circuits 32 (along with a plurality of further precharge/homogenize circuits being of similar or identical structure as the precharge/homogenize circuits 32) may be arranged in one of the plurality of corresponding sense amplifier regions 201, 301, 401, 501, 601 of the DRAM.

Furthermore, the above-mentioned memory cells 22a, that are, as explained above, arranged in the form of a matrix of rows and columns, may be arranged in corresponding cell field regions 201a, 301a, 401a, 501a or array regions of the DRAM (wherein the memory cells 22a that are, in accordance with FIG. 1, arranged at the left side of the read or write/sense amplifier 1, are, for instance, arranged in the cell field region that is positioned at the left of the respective sense amplifier region 201, 301, 401, 501, 601, and wherein the memory cells that are arranged at the right side of the read or write/sense amplifier 1 are, for instance, arranged in the cell field region positioned at the right of the respective sense amplifier region 201, 301, 401, 501, 601).

The above-mentioned local data lines 101, 102 may be coupled with corresponding global data lines which, starting out from a corresponding column decoder region of the DRAM (not illustrated), may extend e.g., substantially parallel to the above-mentioned bit lines 6, 7 (and many other, not illustrated bit lines BL) (and substantially rectangular to the above-mentioned word lines 33 (and many other, not illustrated word lines WL)), and substantially parallel to the above-mentioned pairs of CSL control lines 105, 106 (and many other, not illustrated CSL control lines) through the above-mentioned sense amplifier regions 201, 301, 401, 501, 601 and the above-mentioned cell field regions 201a, 301a, 401a, 501a of the DRAM.

The above-mentioned word lines 33 may each be controlled by control means that are arranged in corresponding segment driver regions 201b, 301b, 401b, 501b or word line driver regions 201b, 301b, 401b, 501b.

Now, reference is again made to FIG. 1. In order to read out data, for instance, from the memory cell 22a ("read access"), the corresponding access transistor 22 is connected trough by activating the corresponding word line 33 (which leads to a connecting through of all of the plurality of access transistors 22, etc. that are connected with the corresponding word line 33 and are arranged in one and the same row of the cell field region).

A corresponding "activate" or word line activate instruction serves, for instance, to activate the word line 33, that has been deactivated before, for instance, by using a corresponding "precharge" or word line deactivate instruction.

By the activating of the word line 33, the charge state stored in the storage capacitance Cc of the corresponding memory cell 22a is applied to the corresponding bit line 6, 7.

This results in a corresponding rise/drop of the voltage present at the bit lines 6, 7 (BL, bBL).

Subsequently, the above-mentioned read or write/sense amplifier 1 is activated, and thus the weak signal emanating from the storage capacitance Cc is amplified by the above-mentioned read or write/sense amplifier 1.

Prior to the reading out of a memory cell, corresponding bit line sections, i.e. corresponding sections of the non-complementary bit line 6 and of the complementary bit line 7, are precharged to the same potential by a corresponding one of the above-mentioned precharge/homogenize circuits 32, which may, for instance, correspond to half the voltage of a bit line in the h-state (=VBLH/2).

To this end, the above-mentioned control circuit activates the above-mentioned control voltage EQL, or the corresponding control signal is, for instance, placed in a logic high state, respectively.

The control voltage EQL or the corresponding control signal is, via the above-mentioned lines 117e, 117c, etc., applied to the gates of the three NMOS-FETs 15, 16, 17 of the corresponding precharge/homogenize circuit 32.

Thus, the precharge/homogenize circuit 32 is switched on, i.e. all three NMOS-FETs 15, 16, 17 are placed in a conductive state.

Thus, via the NMOS-FET 17 ("homogenizer"), the bit line 6 is conductively connected with the complementary bit line 7. Furthermore, via the NMOS-FET 15 ("precharger"), the bit line 6 is conductively connected with the above-mentioned line 115 at which the above-mentioned voltage Vbleq is present. Moreover, via the NMOS-FET 16 ("precharger"), the complementary bit line 7 is conductively connected with the above-mentioned line 116 at which, also, the above-mentioned voltage Vbleq is present (which may, for instance, be VBLH/2).

Directly prior to the reading out of a memory cell, the corresponding precharge/homogenize circuit 32 is switched off (again).

To this end, the above-mentioned control circuit again deactivates the above-mentioned control voltage EQL, or places the corresponding control signal, for instance, in a logic low state, respectively.

Thus, all NMOS-FETs 15, 16, 17 are placed in a locked state.

The bit line 6 is then, by the locked NMOS-FET 17, disconnected or isolated from the complementary bit line 7. Furthermore, by the locked NMOS-FET 15, the bit line 6 is disconnected or isolated from the above-mentioned line 115, and, by the locked NMOS-FET 16, the complementary bit line 7 is disconnected or isolated from the above-mentioned line 116 (and thus both bit lines 6, 7 from the above-mentioned voltage Vbleq).

As is illustrated in FIG. 1, the read or write/sense amplifier 1 is a "shared sense amplifier" that is used both during the reading out of a memory cell (e.g., the memory cell 22a) that is positioned at the left side and of a memory cell that is positioned at the right side along the above-mentioned bit lines 6, 7.

By using the above-mentioned isolation circuits 8, 9, the read or write/sense amplifier 1 is, during the reading out of a memory cell (e.g., the memory cell 22a) disconnected from the side/the bit line section that is not connected with the memory cells to be read out, and is coupled with the side/the bit line section that is connected with the memory cells to be read out (e.g., the memory cell 22a).

The actual reading out of the memory cell (e.g., the memory cell 22a) is initiated shortly thereafter, as mentioned above, by connecting through the corresponding access transistor (e.g., the transistor 22) that is connected with the corresponding storage capacity Cc, in that the corresponding word line (e.g., the word line 33) is activated.

Then, appropriate activation voltages are applied to the read or write/sense amplifier 1, whereupon the read or write/sense amplifier 1 amplifies the potential differences that are transmitted by the corresponding storage capacitance Cc and outputs a correspondingly amplified differential signal.

The correspondingly amplified differential signal is transmitted to the above-mentioned pair of local data lines 101, 102 by the read or write/sense amplifier 1.

In order to connect the above-mentioned pair of local data lines 101, 102 with the read or write/sense amplifier 1, the above-mentioned control signal CSL present at the CSL control lines 105, 106 is placed from a logic low in a logic high state, so that the corresponding transistors 103, 104 ("bit switches"), are connected through.

The above-mentioned amplified differential signal is then transmitted to corresponding global data lines by the above-mentioned pair of local data lines 101, 102, and from there to a further amplifier (so-called "secondary sense amplifier") for further amplification.

Subsequently, the above-mentioned read or write/sense amplifier 1 may be deactivated again.

Then, the above-mentioned control signal CSL present at the CSL control lines 105, 106 is again placed from the above-mentioned logic high in the above-mentioned logic low state, so that the corresponding transistors 103, 104 ("bit switches") disconnect the above-mentioned pair of local data lines 101, 102 from the read or write/sense amplifier 1 again.

Then, in one embodiment if a subsequent access relates to a memory cell that is assigned to another word line than the memory cell of the preceding access, the corresponding word line 33 may be deactivated again. A corresponding "precharge" or word line deactivate instruction, for instance, serves to deactivate the word line 33.

In one embodiment if a subsequent access relates to a memory cell that is assigned to the same word line 33 as the memory cell of the preceding access, the corresponding word line 33 may (first of all) be left in the above-mentioned activated state.

To write data in a memory cell (e.g., the memory cell 22a) ("write access"), a process that is inverse to the above-mentioned process is substantially performed.

In short, a corresponding differential signal is transmitted by the corresponding global data line to the corresponding pair of local data lines 101, 102.

Then, the above-mentioned control signal CSL present at the CSL control lines 105, 106 is placed from the above-mentioned logic low state in a logic high state, so that the corresponding transistors 103, 104 ("bit switches") are connected through.

Thus, the pair of local data lines 101, 102 is connected with the above-mentioned read or write/sense amplifier 1, and the above-mentioned differential signal present at the pair of local data lines 101, 102 is transmitted to the read or write/sense amplifier 1 (and then to the corresponding memory cell 22a that was selected by activating a corresponding one of the above-mentioned word lines 33).

Then, the above-mentioned control signal CSL present at the CSL control lines 105, 106 is placed from the above-mentioned logic high in the above-mentioned logic low state again, so that the corresponding transistors 103, 104 ("bit switches") disconnect the above-mentioned pair of local data lines 101, 102 from the read or write/sense amplifier 1 again.

Like in the above-mentioned read-out process or read access, corresponding bit line sections, i.e. corresponding sections of the non-complementary bit line 6 and of the complementary bit line 7, may be precharged to the same potential by a corresponding one of the above-mentioned precharge/homogenize circuits 32 with the above-mentioned write access, too (e.g., to VBLH/2).

To this end, —correspondingly similar as described above, —the above-mentioned control circuit activates the above-mentioned control voltage EQL, or places the corresponding control signal, for instance, in a logic high state, respectively.

The control voltage EQL or the corresponding control signal is applied to the gates of the three NMOS-FETs 15, 16, 17 of the corresponding precharge/homogenize circuit 32 via the above-mentioned lines 117e, 117c, etc.

Thus, the precharge/homogenize circuit 32 is switched on, i.e. all three NMOS-FETs 15, 16, 17 are placed in a conductive state.

Thus, via the NMOS-FET 17 ("homogenizer"), the bit line 6 is conductively connected with the complementary bit line 7. Furthermore, via the NMOS-FET 15 ("precharger"), the bit line 6 is conductively connected with the above-mentioned line 115 at which the above-mentioned voltage Vbleq is present. Moreover, via the NMOS-FET 16 ("precharger"), the complementary bit line 7 is conductively connected with the above-mentioned bit line 116 at which, also, the above-mentioned voltage Vbleq is present (which may, for instance, be VBLH/2).

Directly prior to the above-mentioned write access, the corresponding precharge/homogenize circuit 32 is switched off (again).

To this end, the above-mentioned control circuit deactivates the above-mentioned control voltage EQL again, or places the corresponding control signal, for instance, in a logic low state again.

Thus, all NMOS-FETs 15, 16, 17 are placed in a locked state.

The bit line 6 is then, by the locked NMOS-FET 17, disconnected or isolated from the complementary bit line 7. Furthermore, by the locked NMOS-FET 15, the bit line 6 is disconnected or isolated from the above-mentioned line 115, and, by the locked NMOS-FET 16, the complementary bit line 7 is disconnected or isolated from the above-mentioned line 116 (and thus both bit lines 6, 7 from the above-mentioned voltage Vbleq).

The above-mentioned precharge or homogenize method or the above-mentioned precharge/homogenize circuit 32 or a correspondingly similar precharge/homogenize circuit may, in an identical or a correspondingly similar manner as explained above, instead with the device with a "shared sense amplifier" or a shared read or write/sense amplifier 1 as explained here by way of example, also be used along with any other read or write/sense amplifiers, in one embodiment with corresponding "non-shared sense amplifiers" or non-shared read or write/sense amplifiers (which then, for instance, do not include any isolation circuits 8, 9), etc., and/or, instead with DRAMs, also with any other integrated circuits, e.g., with semiconductor memory devices, for instance, ROMs, e.g., with PROMs, EPROMs, EEPROMs, etc., or e.g., with flash memory devices, or with other kinds of RAMs than with DRAMs, e.g., with SRAMs, etc., etc.

As will be explained in more detail further below, in the present embodiment it is possible to use, for the transistors available in the read or write/sense amplifier 1 (here: e.g., the NMOS-FETs 2, 3 illustrated in FIG. 1 or the PMOS-FETs 4, 5 illustrated in FIG. 1), during the operation of the read or write/sense amplifier 1 or during the above-mentioned activate cycle (or the above-mentioned read cycle (and correspondingly also during the above-mentioned write cycle)), a substrate potential NSAWELL or PSAWELL that is changeable as explained in more detail further below (here e.g.: alternately a relatively high, in one embodiment e.g., a positive, substrate potential VSA_PWP, and a relatively low, in one embodiment e.g., a negative, substrate potential VSA_PWN_nt).

To this end, corresponding voltages of alternating intensity (e.g., either of the intensity VSA_PWP or of the intensity VSA_PWN_nt) may, via corresponding lines 1112, 1113 or 1114, 1115, be applied to the bulk connections of the transistors 2, 3 or 4, 5 available in the read or write/sense amplifier 1.

As a, positive, substrate potential VSA_PWP, e.g., a voltage ranging between +0.3 V and +0.9 V may be used, in one embodiment, for instance, a voltage ranging between +0.4 V and +0.8 V, e.g., +0.5 V or +0.7 V, etc., for instance, the above-mentioned voltage VBLH/2 (i.e. half the voltage of a bit line in a logic high state).

As a, negative, substrate potential VSA_PWN_nt, e.g., a voltage ranging between 0 V and 1.2 V may be used, in one embodiment, for instance, a voltage ranging between 0 V and −1 V, e.g., 0.5 V, or e.g., the ground potential, etc.

For instance, (still) during the above-mentioned activated state of the word line 33, or (still) during the above-mentioned evaluation process, e.g., even prior to the beginning of the activation of the read or write/sense amplifier 1, or e.g., in one embodiment after the above-mentioned evaluation process, or (shortly) after the activation of the read or write/sense amplifier 1, it may be initiated that the substrate potential NSAWELL used for the transistors 2, 3, 4, 5 of the corresponding read or write/sense amplifier 1 changes from the above-mentioned, positive, substrate potential VSA_PWP to the above-mentioned, negative, substrate potential VSA_PWN_nt.

For triggering the change from the above-mentioned positive substrate potential VSA_PWP to the above-mentioned negative substrate potential VSA_PWN_nt, the "activate" or word line activate instruction causing the above-mentioned activation of the corresponding word line 33, but being delayed by a corresponding duration $\Delta T_1$ for triggering the change of the substrate potential, may be used.

In one embodiment, for instance, a control signal obtained by the delay of the NCS or PCS signal(s) or of corresponding read or write/sense amplifier activate signals may also be used for triggering the change of the substrate potential.

For instance, at a relatively early time, e.g., even prior or a long time prior to a (new) activation of the word line 33, it may be initiated that the substrate potential NSAWELL used for the transistors 2, 3, 4, 5 of the corresponding read or write/ sense amplifier 1 changes from the above-mentioned, negative, substrate potential VSA_PWN_nt (back) to the above-mentioned, positive, substrate potential VSA_PWP (e.g., already shortly before or shortly after the expiration of the preceding activate cycle, e.g., shortly before or shortly after the above-mentioned deactivation of the word line 33 or of the read or write/sense amplifier 1, or as soon as the end of the preceding activate cycle can be recognized).

For triggering the change from the above-mentioned negative substrate potential VSA_PWN_nt to the above-mentioned positive substrate potential VSA_PWP, the "precharge" or word line deactivate instruction causing the above-mentioned deactivation of the corresponding word line 33, but delayed by a corresponding duration for triggering the change of the substrate potential, may be used, or, for instance, a, correspondingly delayed—"Bank Deselect" instruction, etc., etc.

In one embodiment, for the transistors 2, 3, or 4, 5 of the read or write/sense amplifier 1, a corresponding constant or substantially constant substrate potential may also be used instead of the substrate potential changing in the above-mentioned or any other manner, etc.

Figure 3:
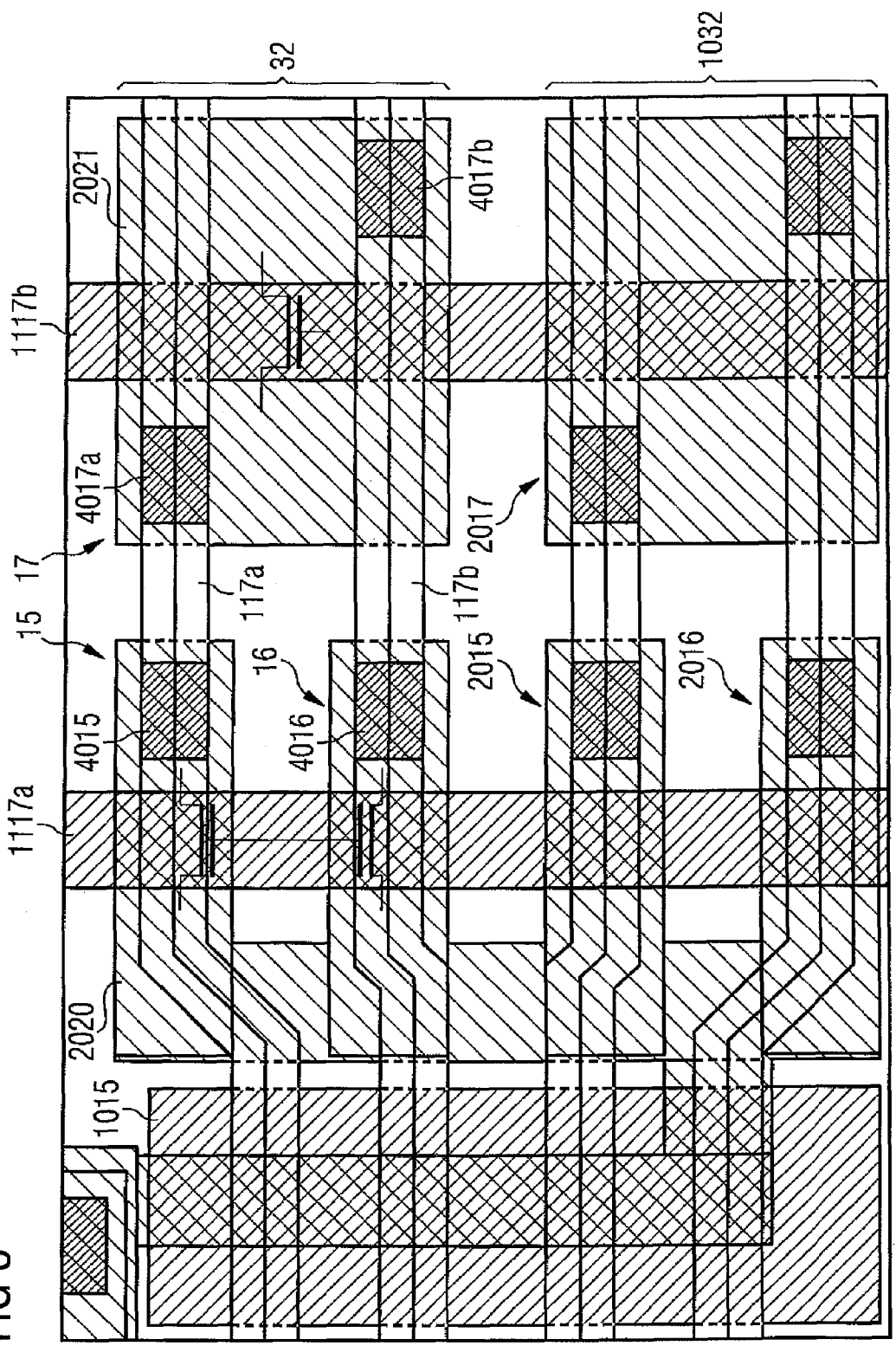
FIG. 3 illustrates a schematic representation of a possible layout of the precharge/homogenize circuit illustrated in FIG. 1, and of a further, adjacent precharge/homogenize circuit.

FIG. 3 illustrates a schematic, exemplary representation of a possible layout of the precharge/homogenize circuit 32 illustrated in FIG. 1, and of a further, adjacent precharge/ homogenize circuit 1032.

A first end of the source drain path of the first NMOS transistor 17 of the three corresponding NMOS transistors 15, 16, 17 of the precharge/homogenize circuit 32 which acts as a "homogenizer" is, starting out from a contact region 4017a, via the above-mentioned line 117a and a further contact region 4015, connected to a first end of the source drain path of the second NMOS transistor 15 of the three corresponding NMOS transistors 15, 16, 17 which acts as a "precharger" (and to the above-mentioned bit line 6).

Additionally, a second end of the source drain path of the first NMOS transistor 17 of the three corresponding NMOS transistors 15, 16, 17 of the precharge/homogenize circuit 32 is, starting out from a contact region 4017b, via the above-mentioned line 117b and a further contact region 4016, connected to a first end of the source drain path of the third NMOS transistor 16 of the three corresponding NMOS transistors 15, 16, 17 which also acts as a "precharger" (and to the above-mentioned complementary bit line 7).

A second end of the source drain path of the second NMOS transistor 15 is, for instance via the above-mentioned line 115, connected to a line 1015 to which the above-mentioned (constant) voltage Vbleq may be applied.

Correspondingly similar, a second end of the source drain path of the third NMOS transistor 16 is, for instance, via the above-mentioned line 116, also connected to the line 1015 having the above-mentioned voltage Vbleq.

The gates of the second and third NMOS-FETs 15, 16 of the precharge/homogenize circuit 32 are, via a line 1117a, connected with each other, and with the gates of a second and third NMOS-FET 2015, 2016, which also act as "prechargers", of the further, adjacent precharge/homogenize circuit 1032.

The gate of the first NMOS-FET 17 of the precharge/ homogenize circuit 32 is, via a line 1117b, connected with the gate of a first NMOS-FET 2017, acting as a "homogenizer", of the further, adjacent precharge/homogenize circuit 1032.

To the above-mentioned lines 1117a, 1117b, that run substantially parallel, and thus also to the gates of the NMOS-FETs 15, 16, 17 or 2015, 2016, 2017, the above-mentioned control voltage EQL may be supplied, for instance, via the above-mentioned line 117e by the above-mentioned control circuit (so as to, jointly, switch on or off the precharge/homogenize circuits 32 or 1032).

As results from FIG. 3, the above-mentioned line 1015 may, for instance, run parallel to the above-mentioned lines 1117*a* or 1117*b* (and, for instance, substantially perpendicular to the bit lines 6, 7 controlled by the above-mentioned precharge/homogenize circuit 32 (or substantially perpendicular to corresponding further bit lines running parallel to the bit lines 6, 7 and controlled by the above-mentioned further precharge/homogenize circuit 1032)).

As results further from FIG. 3, the above-mentioned second and third NMOS-FETs 15, 16, 2015, 2016, acting as "prechargers", of the above-mentioned precharge/homogenize circuits 32, 1032 (and corresponding further NMOS-FETs acting as "prechargers" of further, not illustrated precharge/homogenize circuits) are arranged in a first row side by side.

Correspondingly similar, the above-mentioned first NMOS-FETs 17, 2017, acting as "homogenizers", of the above-mentioned precharge/homogenize circuits 32, 1032 (and corresponding further NMOS-FETs acting as "homogenizers" of further, not illustrated precharge/homogenize circuits) are arranged in a second row being parallel to the first row (wherein each of the above-mentioned first NMOS-FETs 17, 2017 is arranged directly adjacent to the corresponding second and third NMOS-FETs 15, 16, 2015, 2016 of the respective precharge/homogenize circuit 32, 1032).

As results from FIG. 3, the diffusion regions of the NMOS-FETs 17 or 2017 acting as "homogenizers" are separate from the diffusion regions 2020 of the corresponding NMOS-FETs 15, 16 or 2015, 2016 acting as "prechargers" of the corresponding precharge/homogenize circuit 32 or 1032 (wherein, for instance, the above-mentioned source drain paths of the corresponding NMOS transistors are formed in the diffusion regions 2020 or 2021).

As results from the above explanations and from FIG. 3, the NMOS-FETs 15, 16, 17 or 2015, 2016, 2017 of the above-mentioned precharge/homogenize circuits 33, 1032 are arranged such that, with relatively low path resistances, a relatively high coupling symmetry can be achieved (namely both on switching on and on switching off of the precharge/homogenize circuits 32, 1032).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
   a first precharge/homogenize circuit with at least one switching element acting as a homogenizer and at least two switching elements acting as prechargers;
   at least one second precharge/homogenize circuit with at least one switching element acting as a homogenizer and at least two switching elements acting as prechargers,
   wherein a diffusion region of the switching element acting as a homogenizer of the first precharge/homogenize circuit is separated from a diffusion region of the switching elements acting as prechargers of the first precharge/homogenize circuit,
   wherein the switching elements acting as prechargers of the first precharge/homogenize circuit and of the second precharge/homogenize circuit are arranged in a row side by side, and
   wherein the diffusion region of the switching element acting as a homogenizer of the first precharge/homogenize circuit is separated from a diffusion region of the switching element acting as homogenizer of the second precharge/homogenize circuit.

2. The device of claim 1, wherein the at least two switching elements acting as prechargers of the first precharge/homogenize circuit are arranged in the same diffusion region.

3. The device of claim 1, wherein the switching elements acting as homogenizers of the first precharge/homogenize circuit and of the second precharge/homogenize circuit are arranged in a further row side by side.

4. The device of claim 3, wherein the row of switching elements acting as prechargers is arranged in parallel to the further row of the switching elements acting as homogenizers.

5. The device of claim 1, wherein the switching elements acting as prechargers of the first precharge/homogenize circuit and of the second precharge/homogenize circuit are arranged in the same diffusion region.

6. The device of claim 1, wherein the switching elements are transistors.

7. The device of claim 6, wherein the transistors are NMOS-FETs.

8. The device of claim 6, wherein the transistors are PMOS-FETs.

9. The device of claim 1, comprising:
   a first line; and
   a second line parallel to the first line,
   wherein each switching element acting as a precharger of the first precharge/homogenize circuit and of the second precharge/homogenize circuit includes a gate directly coupled to the first line, and
   wherein each switching element acting as a homogenizer of the first precharge/homogenize circuit and of the second precharge/homogenize circuit includes a gate directly coupled to the second line.

10. A memory device module comprising:
    a sense amplifier;
    a first precharge/homogenize circuit including a first homogenizer switching element having a first diffusion region and a first precharger switching element having a second diffusion region;
    a second precharge/homogenize circuit including a second homogenizer switching element having a third diffusion region and a second precharger switching element having the second diffusion region;
    wherein the first diffusion region is separated from the second diffusion region;
    wherein the third diffusion region is separated from the first diffusion regions;
    wherein the first and second precharger switching elements are arranged in a first row side by side;
    wherein the first and second homogenizer switching elements are arranged in a second row side by side; and
    a memory array coupled to the sense amplifier.

11. The memory device module of claim 10, comprising:
    a first line; and
    a second line parallel to the first line,
    wherein each of the first and second precharger switching elements includes a gate directly coupled to the first line, and wherein each of the first and second homogenizer switching elements includes a gate directly coupled to the second line.

12. An electronic system comprising:
a semiconductor device including a first precharge/homogenize circuit comprising:
  at least one first switching element acting as a homogenizer; and
  at least one first switching element acting as a precharger,
  wherein a first diffusion region of the first switching element acting as a homogenizer is separated from a second diffusion region of the first switching element acting as a precharger,
wherein the semiconductor device includes a second precharge/homogenize circuit comprising:
  at least one second switching element acting as a homogenizer; and
  at least one second switching element acting as a precharger,
  wherein a first diffusion region of the second switching element acting as a homogenizer is separated from a second diffusion region of the second switching element acting as a precharger,
wherein the first and second switching elements acting as prechargers are arranged in a first row side by side,
wherein the first and second switching elements acting as homogenizers are arranged in a second row side by side; and
wherein the second row is parallel to the first row.

13. The electronic system of claim 12, comprising:
a first line; and
a second line parallel to the first line,
wherein each of the first and second switching elements acting as a precharger includes a gate directly coupled to the first line, and
wherein each of the first and second switching elements acting as a homogenizer includes a gate directly coupled to the second line.

14. A method for operating a semiconductor device, comprising:
providing at least one first precharge/homogenize circuit connected with at least one first bit line and at least one complementary first bit line, comprising:
  at least one first switching element acting as a homogenizer; and
  at least one first switching element acting as a precharger,
  wherein a diffusion region of the first switching element acting as a homogenizer is separated from a diffusion region of the first switching element acting as a precharger, and
  switching on the precharge/homogenize circuit for precharging and homogenizing potentials present at the first bit lines; and
providing at least one second precharge/homogenize circuit connected with at least one second bit line and at least one complementary second bit line, comprising:
  at least one second switching element acting as a homogenizer; and
  at least one second switching element acting as a precharger,
  wherein a diffusion region of the second switching element acting as a homogenizer is separated from a diffusion region of the second switching element acting as a precharger,
wherein the first and second switching elements acting as prechargers are arranged in a first row side by side,
wherein the first and second switching elements acting as homogenizers are arranged in a second row side by side;
wherein the second row is parallel to the first row; and
wherein the diffusion region of the first switching element acting as the homogenizer of the first precharge/homogenize circuit is separated from the diffusion region of the second switching element acting as the homogenizer of the second precharge/homogenize circuit.

15. The method of claim 14, comprising:
providing a first line; and
providing a second line parallel to the first line,
wherein each of the first and second switching elements acting as a precharger includes a gate directly coupled to the first line, and
wherein each of the first and second switching elements acting as a homogenizer includes a gate directly coupled to the second line.

16. An electronic system comprising:
a first line;
a second line parallel to the first line;
a first precharge/homogenize circuit including a first homogenizer switching element having a first diffusion region and a first gate, and a first precharger switching element having a second diffusion region and a second gate; and
a second precharge/homogenize circuit including a second homogenizer switching element having a third diffusion region and a third gate, and a second precharger switching element having a fourth diffusion region and a fourth gate,
wherein the first diffusion region is separated from the second diffusion region,
wherein the third diffusion region is separated from the fourth diffusion region,
wherein the first line is directly coupled to the first gate and the third gate, and
wherein the second line is directly coupled to the second gate and the fourth gate.

17. The system of claim 16, wherein the first precharge/homogenize circuit comprises at least two switching elements acting as prechargers.

18. The system of claim 17, wherein the switching elements are transistors.

19. The system of claim 17, wherein the at least two switching elements acting as prechargers are arranged in the same diffusion region.

* * * * *